United States Patent [19]

Kage et al.

[11] 4,339,727
[45] Jul. 13, 1982

[54] WAVEFORM CONVERTING CIRCUIT

[75] Inventors: Kouzou Kage; Ikio Yoshida, both of Tokyo, Japan

[73] Assignee: Nippon Electric Co., Ltd., Tokyo, Japan

[21] Appl. No.: 18,396

[22] Filed: Mar. 7, 1979

[30] Foreign Application Priority Data

Mar. 7, 1978 [JP] Japan .................................. 53-26367
Mar. 7, 1978 [JP] Japan .................................. 53-26368

[51] Int. Cl.³ .............................................. H03K 9/08
[52] U.S. Cl. .................................. 329/106; 307/358; 307/359; 307/518; 307/543; 328/149; 375/76; 375/103
[58] Field of Search .............. 328/146, 147, 149; 307/237, 353, 358, 359, 362; 330/107; 375/76, 103; 329/106

[56] References Cited

U.S. PATENT DOCUMENTS

| | | | |
|---|---|---|---|
| 3,679,987 | 7/1972 | Moschytz | 330/107 |
| 3,700,920 | 10/1972 | Eyler | 307/351 |
| 3,818,356 | 6/1974 | Kinbara | 307/362 |
| 3,893,035 | 7/1975 | Higgens | 328/146 |
| 3,898,573 | 8/1975 | Sherman | 307/237 |
| 3,968,384 | 7/1976 | Tracey et al. | 307/237 |
| 3,999,084 | 12/1976 | Beaudette | 307/237 |
| 4,071,781 | 1/1978 | Kayalioglu | 307/358 |
| 4,152,733 | 5/1979 | Melwisch | 307/237 X |
| 4,175,256 | 11/1979 | Dulikian | 328/149 |

*Primary Examiner*—John S. Heyman
*Attorney, Agent, or Firm*—Sughrue, Mion, Zinn, Macpeak & Seas

[57] ABSTRACT

Waveform converting circuits are disclosed which eliminate errors in data reproduction due to the transitional response of low or high pass filters even if the data signal contains a D.C. component. The converting circuits have a comparator with first and second input terminals. The comparator produces a "1" or "0" output depending on the comparison of the voltages of input signals fed to these first and second input terminals. In one type of converting circuit, a low pass filter is connected between the signal input terminal and the second input terminal of the comparator, while the signal input terminal is directly connected to the first input terminal of the comparator. A feedback circuit including a low pass filter is connected between the output and the second input terminals of the comparator. In another type of converting circuit, a high pass filter is connected between the signal input terminal and the first input terminal of the comparator, and a limiter is connected to the output of the high pass filter. A feedback circuit is provided between the output and either the first or second input terminals of the comparator.

6 Claims, 18 Drawing Figures

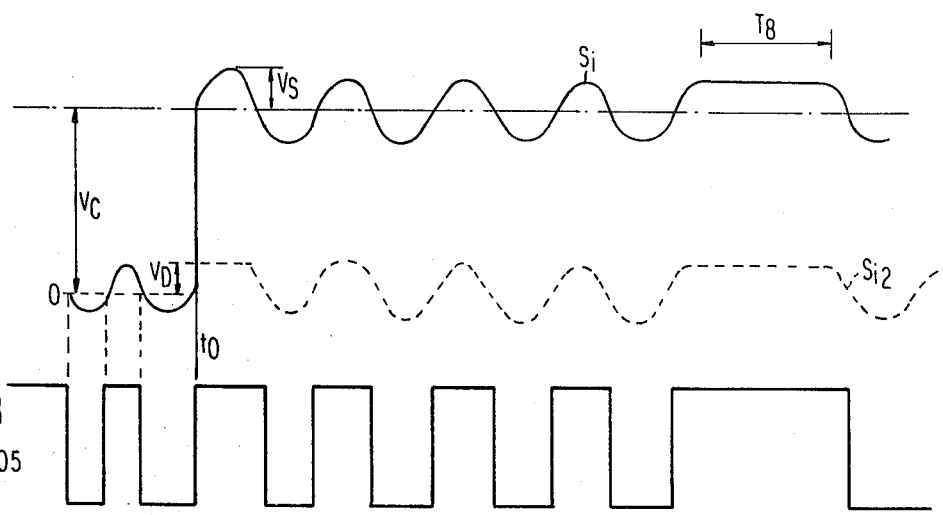
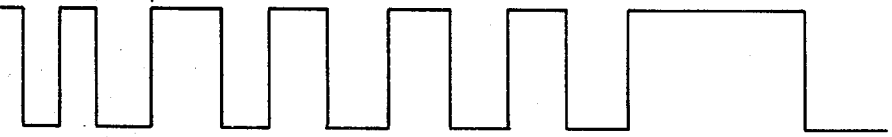
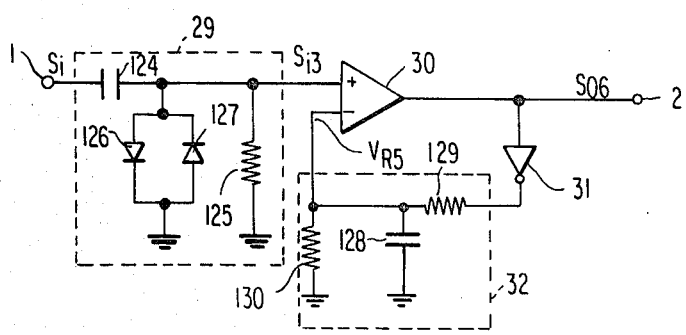
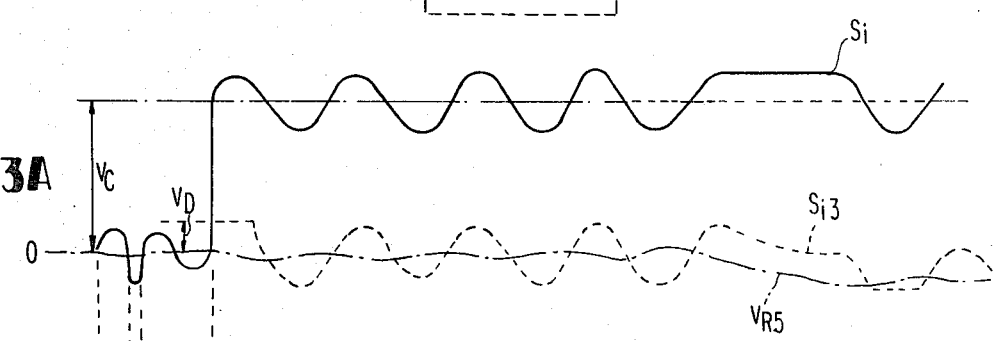
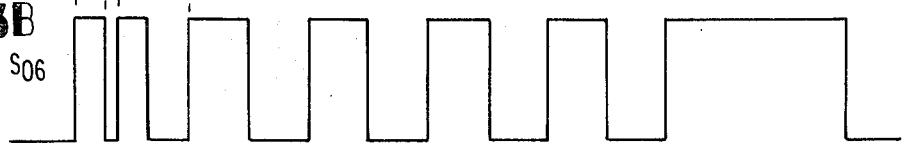

WAVEFORM CONVERTING CIRCUIT

BACKGROUND OF THE INVENTION

This invention relates to waveform converting circuits, and particularly to an improvement of waveform converting circuits involving comparators.

In a transmission/reception system of data signals, because of the presence of transformers and coupling capacitors inserted into the transmission path, it is generally difficult to faithfully convey the D.C. or low-frequency components of data signals. As a consequence, data are reproduced on the receiving side by using the average voltage of data signals, obtained with a low pass filter (LPF), as the comparator's threshold value (hereinafter called the comparison reference value) for "1"-"0" determination of data signals (see U.S. Pat. No. 3,845,412, especially FIG. 13 thereof).

Where, conversely, NRZ (Non-Return to Zero) signals are used as data signals or where D.C. components are contained in data signals for some reason or another, data are reproduced on the receiving side by removing the D.C. components with a high pass filter (HPF) or the like and comparing the signal voltages with the reference voltage (ground potential).

Since capacitors, which are transitional response elements, are used for reproduction or removal or D.C. components in such systems, if data signals retain a continuously high or low level, there will arise a discrepancy in comparison reference value reproduced or a drop of data signals to the ground potential, resulting in an error in data reproduction. These shortcomings have been avoided by, for instance, using a large-capacity capacitor to pass even low-frequency components of data signals, or employing split-phase signals so that the data signals themselves may not contain low-frequency components. However, these remedies lead to new problems; a large-capacity capacitor retards the responses of the converting circuit, or special treatment of data signals entails greater complexity of the system.

SUMMARY OF THE INVENTION

The object of the present invention is to provide a waveform converting circuit representing a solution of these problems.

In accordance with this invention, there is provided a waveform converting circuit primarily comprising: a comparator having a first input terminal and a second input terminal for comparing the voltages of input signals fed to these first and second input terminals; a signal input terminal connected to the first input terminal; a LPF coupled between this signal input terminal and the second input terminal; and a feedback means coupled between the output of the comparator and the second input terminal for maintaining the output of said first low pass filter at a predetermined level.

BRIEF DESCRIPTION OF THE DRAWINGS

The present invention will be described in further detail below with reference to the accompanying drawings:

FIGS. 11A and 11B are time charts showing the operation of the circuit illustrated in FIG. 10;

FIG. 12 is a fifth embodiment of this invention, a modification of the circuit illustrated in FIG. 10; and FIGS. 13A and 13B are time charts showing the operation of the circuit illustrated in FIG. 12.

DESCRIPTION OF THE PRIOR ART

Figure 1:
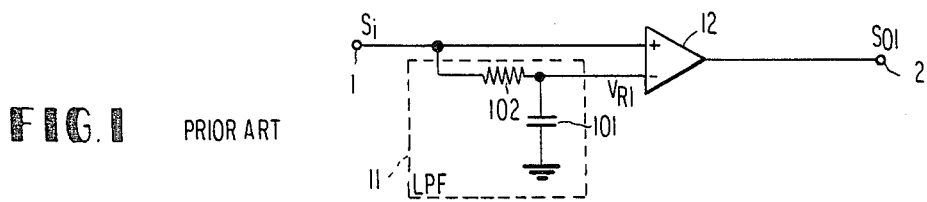
FIG. 1 illustrates a waveform converting circuit of the prior art, which reproduces data by reproducing the comparison reference value from data signals.
Figure 2A:
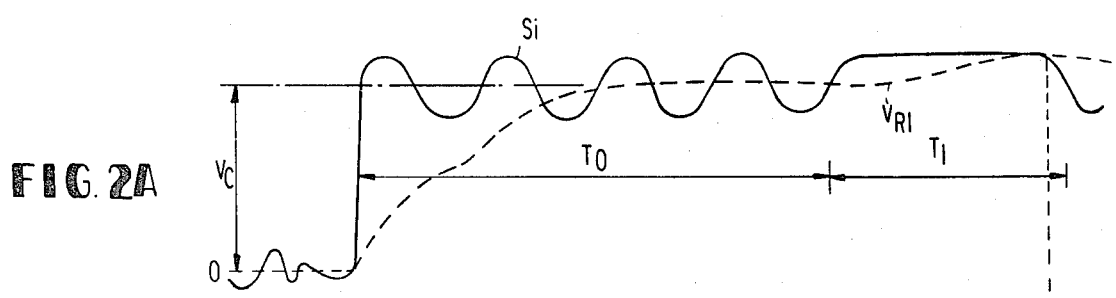
FIGS. 2A and 2B are time charts showing the operation of the circuit illustrated in FIG. 1.
Figure 2B:
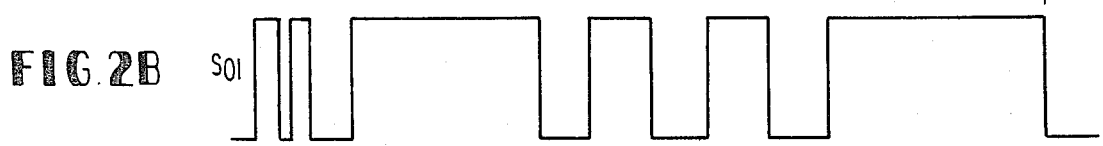

In the circuit illustrated in FIG. 1, a data signal $S_i$ fed to an input terminal 1 is compared in a comparator 12 with a comparison reference voltage $V_{R1}$ obtained by smoothing the input data signal $S_i$, to produce a reproduced data $S_{O1}$ at an output terminal 2. Hereupon, when the receiver's center frequency has a discrepancy by $\Delta f$ from the transmitter's center frequency $f_o$ in an FM communication system, a D.C. voltage corresponding to this $\Delta f$ is generated at the output of the frequency discriminating circuit in an FM receiver and superposed on the input data signal. When such data signal is entered into the circuit of FIG. 1, the comparison reference voltage $V_{R1}$ is brought closer to the average voltage $V_a$ of the input data signal $S_i$ by a low pass filter (LPF) 11 consisting of a capacitor 101 (having a capacitance of $C_1$) and a resistor 102 (having a resistance of $R_1$). If the time constant $R_1C_1$ of the filter 11 is made greater, the approach of the comparison reference voltage $V_{R1}$ to the average voltage $V_a$ of the signal will be delayed, so that a longer time is required for putting the comparator circuit 12 in a normal comparison operation. If, conversely, the time constant $R_1C_1$ is made smaller, when the signal level continues to be high as in section $T_1$ of FIG. 2A, the comparison reference voltage $V_{R1}$ will approach the high level of the input signal because of the presence of the LPF 11. This might cause erroneous comparison with noise contained in the signal $S_i$. Thus the waveform converting circuit of FIG. 1 has a disadvantage that it does not permit the use of a signal pattern in which a high or low level is retained for a long period. Reference letters $V_c$ in FIG. 2A represents the ideal value of the comparison reference voltage, and FIG. 2B illustrates the reproduced data $S_{O1}$.

Figure 3:
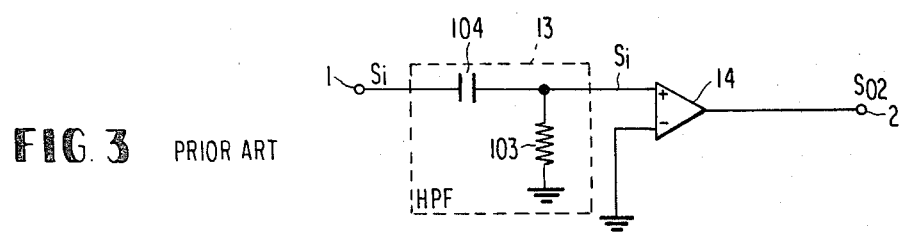
FIG. 3 illustrates another waveform converting circuit of the prior art, which reproduces data by removing the D.C. components of data signals.
Figure 4A:
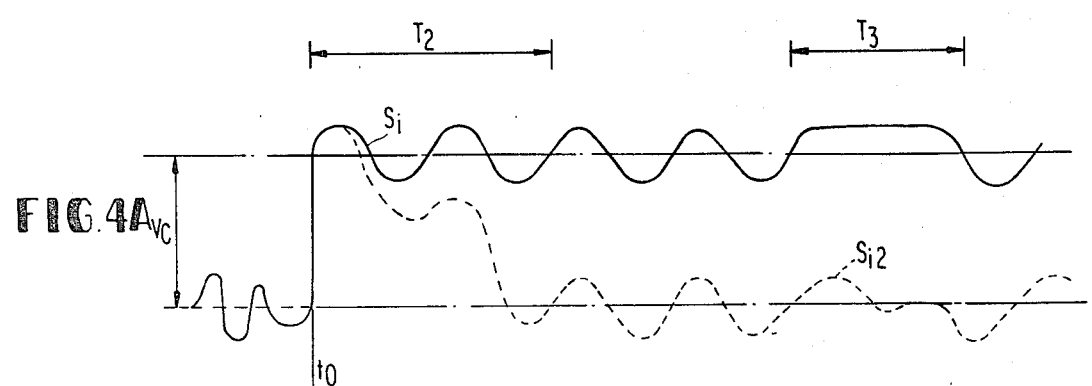
FIGS. 4A and 4B are time charts showing the operation of the circuit illustrated in FIG. 3.
Figure 4B:
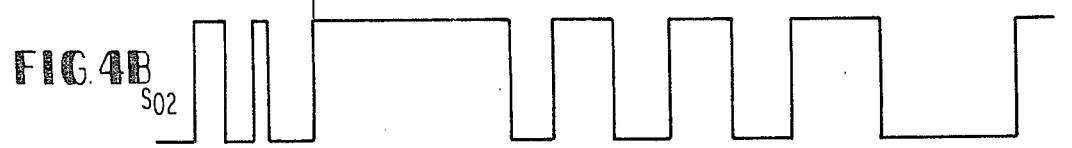

In the circuit illustrated in FIG. 3, when a data signal $S_i$ which contains the D.C. voltage as referred to above is entered from an input terminal 1, this data signal $S_i$, after elimination of its D.C. component by a high pass filter (HPF) 13, undergoes waveform conversion in a comparator 14, whose comparison reference voltage is the ground potential, to produce a reproduced data $S_{O2}$ at a terminal 2. When, in this process of data reproduction, the data signal $S_i$ passes the HPF 13 which consists of a capacitor 104 (having a capacitance of $C_2$) and a resistor 105 (having a resistance of $R_2$), the output signal $S_{i1}$ of the HPF 13 momentarily reaches the average voltage $V_a$ of the data signal $S_i$, but it thereafter gradually decreases to approach the zero level. Hereupon the time constant $C_2R_2$ of the HPF 13 requires a certain magnitude because the HPF 13 has to remove the D.C. voltage $V_a$ and at the same time pass the low-frequency components of the data signal, with the result that, during the period of time in which the comparison reference voltage returns to the zero level (section $T_2$ in FIG. 4A), errors arise in the reproduced data from the comparator 14. If the time constant $R_2C_2$ is made too small in an attempt to avoid such errors, the voltage $V_{a1}$ of the input signal $S_{i1}$ to the comparator 14 will drop to a low level as shown in FIG. 4A where the data signal retains a continuously high level (section $T_3$ in FIG. 4A), so that faithful reproduction of data is not possible. FIG. 4B illustrates the data $S_{O2}$ reproduced by the waveform converting circuit of FIG. 3.

DESCRIPTION OF THE PREFERRED EMBODIMENTS

Figure 5:
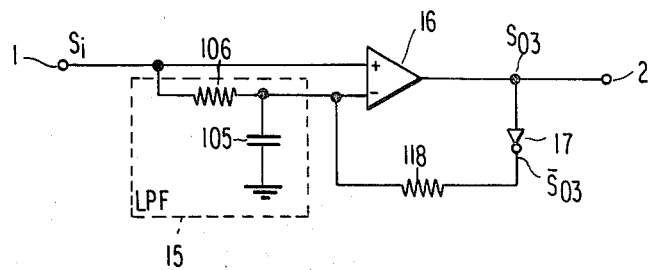
FIG. 5 illustrates a first embodiment of this invention, a waveform converting circuit which reproduces data by reproducing the comparison reference value from data signals.

The comparison reference voltage $V_{R2}$ in the circuit of FIG. 5 is the voltage sum of the signal resulting from the passage of an input data signal $S_i$ (having an average voltage of $V_a$) through a LPF 15, consisting of a capacitor 105 (having a capacitance of $C_3$) and a resistor 106 (having a resistance of $R_3$) and of the signal resulting from the passage of the output $S_{O3}$ (having an average voltage of $V_{O3}$) of an inverter 17 through another LPF, consisting of the capacitor 105 and another resistor 18 (having a resistance of $R_4$). Thus, after the data signal $S_i$ is received and reaches a constant stage, the comparison reference voltage $V_{R2}$ will become $$V_{R2} = (V_a R_4 + V_{O3} R_3)/(R_3 + R_4)$$

Figure 6:
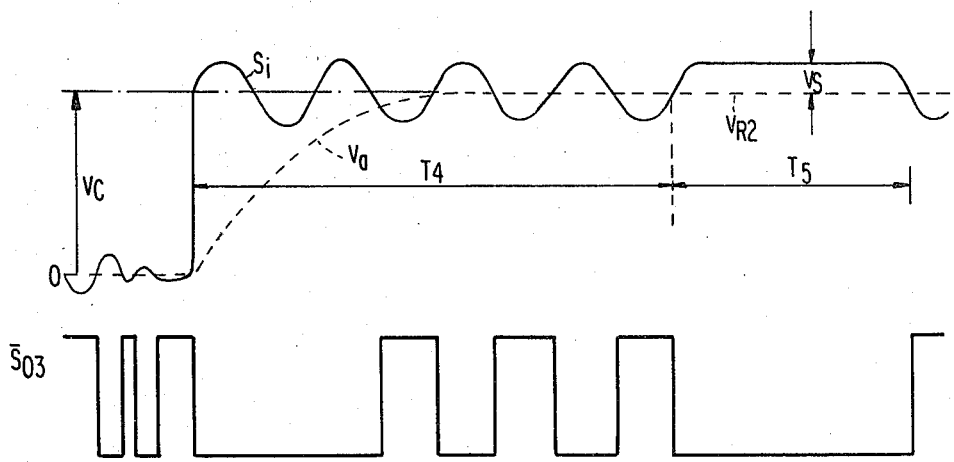
FIGS. 6A and 6B are time charts showing the operation of the circuit illustrated in FIG. 5.

Now suppose that a certain period of time has elapsed with the data signal $S_i$ remaining at a high level as in section $T_5$ of FIG. 6A. If, then, the ideal comparison reference voltage is represented by $V_c$ and the amplitude of the data signal $S_i$ by $V_s$, the average voltage of the data signal $S_i$ will be $V_c + V_s$, and therefore the comparison reference voltage $V_{R2}$ will be $$V_{R2} = \{V_c R_4/(R_3+R_4)\} + \{(V_s R_4 + V_{O3} R_3)/(R_3+R_4)\}$$

Here, if the pertinent values are so selected as to make $R_3 << R_4$ and $V_{O3} = -V_s R_4/R_3$, a relationship of $V_{R2} \simeq V_c$ will be given, with the result that the comparison reference voltage $V_{R2}$ will not deviate from the ideal comparison reference voltage $V_c$ even if the signal retains a continuously high level. While what has been said so far concerns an instance in which the signal retains a high level, the same holds true where the signal remains at a low level. Furthermore, this condition also satisfies the requirement of a case in which the signal level is alternately high and low as in section $T_4$ of FIG. 6A or of the initial transitional state of section $T_5$ of same. Thus, whereas the time constant of the LPF including the capacitor $C_3$ in the transitional state of sections $T_4$ and $T_5$ is represented by $C_3R_3R_4/(R_3+R_4)$, as there is a condition to make $R_3 << R_4$, the capacitor 105 does not have sufficient time to be charged by the voltage $V_{O3}$ when the input signal level is alternately high and low or in the transitional state of section $T_5$, with the result that the time constant $(C_3R_3R_4/(R_3+R_4) \simeq C_3R_3$. This means that the capacitor 105 is charged solely by the voltage $V_a$, and that $V_{R2} \simeq V_c$.

Figure 7:
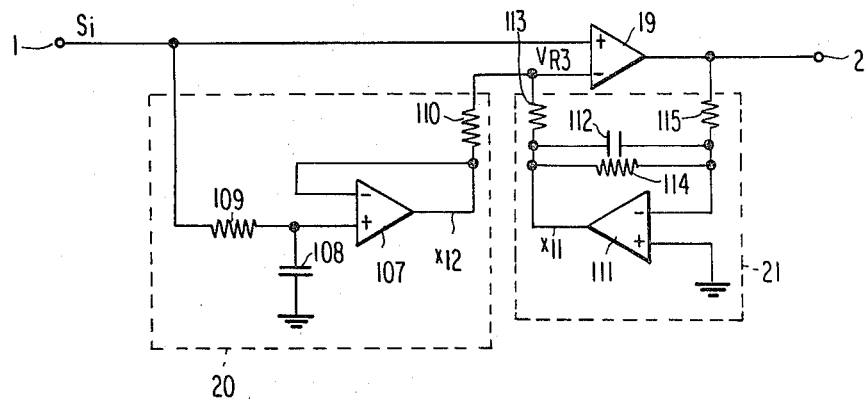
FIG. 7 illustrates a second embodiment of this invention, a modification of the circuit illustrated in FIG. 3.

In FIG. 7, an input signal $S_i$ is supplied to a LPF 20, and the output of a comparator 19 is supplied to another LPF 21. The LPF 20 here consists of an amplifier 107, resistors 109 and 110 (having resistances of $R_5$ and $R_6$, respectively) and a capacitor 108 (having a capacitance of $C_4$). The LPF 21 is composed of an amplifier 111, resistors 113 to 115 (having resistances of $R_7$ to $R_9$, respectively) and a capacitor 112 (having a capacitance of $C_5$). The comparison reference voltage $V_{R3}$ is the composite of the output voltages of the LPFs 20 and 21. Accordingly, the reference voltage $V_{R3}$ has a relationship of $V_{R3} = (V_{11}R_6 + V_{12}R_7)/(R_6 + R_7)$ to the voltages $V_{11}$ and $V_{12}$ of the outputs $X_{11}$ and $X_{12}$ of the amplifiers 107 and 111, respectively. Thus, if the resistances $R_6$ and $R_7$ and the voltage $V_{11}$ are so selected that a relationship of $R_6V_{11} = -R_7V_s$ may hold in a constant state and the time constant $R_5C_4$ is set to be equal to $C_5R_8R_9/(R_8+R_9)$, the reference voltage $V_{R3}$ can be maintained at its ideal level like in the first embodiment of this invention illustrated in FIG. 5. Since a small time constant $R_5C_4$ can be selected in this instance as well, it is possible, at the beginning of signal reception, to make the comparison reference voltage $V_{R3}$ quickly reach its ideal level.

Figure 8:
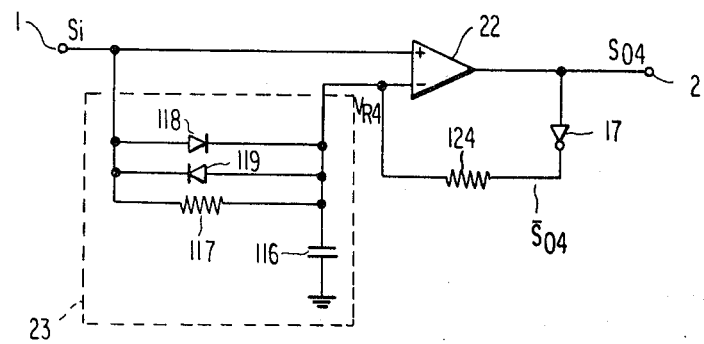
FIG. 8 illustrates a third embodiment of this invention, another modification of the circuit illustrated in FIG. 3.
Figure 9A:
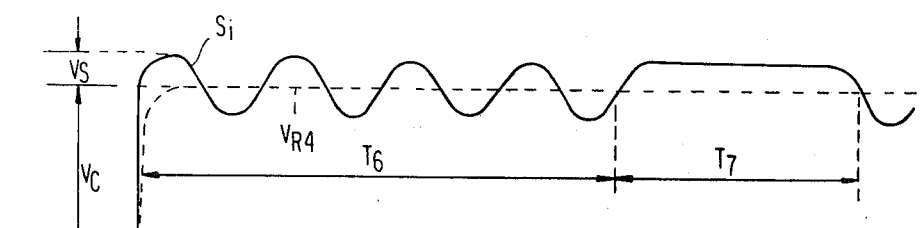
FIGS. 9A and 9B are time charts showing the operation of the circuit illustrated in FIG. 8.
Figure 9B:
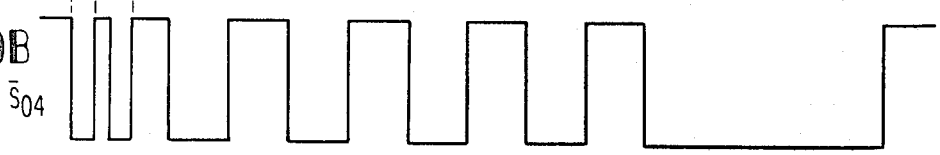

FIG. 8 illustrates a modification of the circuit of FIG. 5, to which diodes 118 and 119 are added here. The saturation voltages of the diodes 118 and 119 are set slightly higher than the amplitude voltage $V_s$ of the input data signal $S_i$. The saturation voltages being so set, while this circuit will come to have similar characteristics to the embodiment illustrated in FIG. 5 some time after the start of signal reception, if, in the initiation of signal reception, the amplitude of the input data signal $S_i$ rises or falls beyond the voltage $V_s$, either one of the diodes 118 and 119 will be actuated. Therefore the comparison reference voltage $V_{R4}$ can reach its ideal level $V_c$ in a very short period of time as illustrated in FIG. 9A. This quick rise of the comparison reference voltage $V_{R4}$ makes possible faithful data reproduction from the very beginning, as illustrated in FIG. 9B, which shows the inverted signal of a reproduced data $S_{O4}$ from the input data $S_i$.

As can be understood from the embodiments described above, a waveform converting circuit constructed in accordance with this invention is able to maintain, after the start of data signal reception, the comparison reference voltage at its ideal level without requiring a large time constant for the LPF even if the data signal retains a continuously high or low level. A small time constant of the LPF further means that the comparison reference voltage can quickly reach its ideal level in the early phase of data signal reception.

Figure 10:
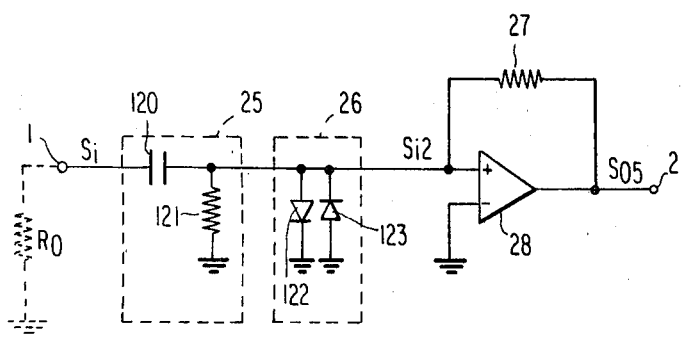
FIG. 10 illustrates a fourth embodiment of this invention, a waveform converting circuit which reproduces data by removing the D.C. components of data signals.

Next will be described the circuit illustrated in FIG. 10, a fourth embodiment of the present invention. An input data signal $S_i$ (having an average voltage of $V_a$) having an amplitude voltage of $V_s$ passes a HPF 25 consisting of a capacitor 120 (having a capacitance of $C_7$) and a resistor 121 (having a resistance of $R_{11}$), where its D.C. components is eliminated. The output of the HPF 25 is limited by a limiter 26 (comprising diodes 122 and 123) not to exceed the forward voltage $V_D$ of the diodes. The voltage $V_D$ is selected to be somewhat higher than the voltage amplitude $V_s$ of the data signal. Having passed the limiter 26, the signal is compared by a comparator 28 with a comparison reference voltage (zero level). The voltage $V_{05}$ of the output $S_{05}$ of the comparator 28 is fed back by way of a resistor 27 (having a resistance of $R_{12}$) to the uninverted input terminal of the comparator 28. The transitional response characteristic of the voltage at this time is determined by the resistances $R_{11}$ and $R_{12}$ and the capacity $C_7$, and the time constant then is $C_7(R_0+R_{11}R_{12}/(R_{11}+R_{12}))$, where $R_0$ is the resistance of a circuit immediately preceding the converting circuit as viewed from the input point of the converting circuit. The voltage $V_{a2}$ of the input signal $S_{i2}$ to the comparator ultimately reaches $V_{05}R_{11}/(R_{11}+R_{12})$. On the other hand, the transitional response of the input signal $S_i$ has the same time constant. That is to say, when the input signal $S_i$ retains a continuously high level as in section $T_8$ of FIG. 11A, the time constant of the voltage decrease of the data signal having passed the capacitor 120 is equal to the time constant of the voltage increase of the signal resulting from the feedback of the output $S_{05}$ of the comparator 28 by way of the resistor 27. Thereby there is prevented the voltage drop to the zero level in the data signal input part of the comparator, an inevitable shortcoming of any waveform converting circuit of the prior art. This waveform converting circuit further prevents erroneous comparison owing to transitional response at the time of signal input by intercepting the D.C. component $V_a$ with the diodes 122 and 123 which constitute the limiter 26. When, for instance, a postive voltage $V_a$ is applied to the signal, the diode 122 is actuated to prevent the input voltage $V_{a2}$ to the comparator 28 from rising above the voltage $V_D$. Since, at this time, the time constant determined by the product of the resistance of the actuated diode and the capacity of the capacitor 120 is very small, the input voltage $V_{a2}$ to the comparator 28 is quickly drawn within the voltage $V_D$. When a negative voltage is applied to the signal, the diode 123 is actuated to give a similar result. FIG. 11B illustrates the reproduced data $S_{05}$.

The embodiment illustrated in FIG. 12 will be described below with reference to FIGS. 13A and 13B. The D.C. component of an input data signal $S_i$ is eliminated by a circuit 6 which includes a HPF consisting of a capacitor 124 (having a capacitance of $C_8$) and a resistor 125 (having a resistance of $R_{13}$) comprising diodes 126 and 127. The input signal $S_{i3}$ to a comparator 30 has the waveform illustrated in FIG. 13A. Up to this point, if the data signal retains a continuously high or low level, the HPF would reduce the voltage $V_{a3}$ of the signal $S_{i3}$ to the zero level as in a waveform converting circuit of the prior art. This action is compensated for by negatively feeding back the output $S_{06}$ of the comparator 30 to the inverted input terminal of the comparator 30 by way of a code inverter 31 and a LPF 32 (consisting of a capacitor 128 and resistors 129 and 130). Thus, as the output $S_{i3}$ of the HPF approaches the zero level, the comparison reference voltage $V_{R5}$ of the fed-back signal transitionally responds so as to maintain a certain potential difference from the output $S_{i3}$ of the HPF (as illustrated in FIG. 13A). It has to be noted that, as is obvious from FIG. 13A, the maximum amplitude of the output signal $S_{06}$ is so set as not to exceed the voltage $V_D$ because, if the input data signal $S_i$ is inverted after it has retained a continuously high or low level, its D.C. component is intercepted by the diode 126 or 127.

As described above, in accordance with this invention there is provided a waveform converting circuit which is free from erroneous determination due to a transitional response by the LPF or HPF even if a data signal contains a D.C. component, and from erroneous determination owing to the retention of a continuously high or low level by the data signal, and accordingly is capable of faithful data reproduction.

What is claimed is:

1. A waveform converting circuit for receiving an input data signal having an a.c. component varying between high and low levels and providing an output having level variations corresponding to said a.c. component, said circuit comprising:
   a high pass filter for filtering said input data signal to provide a comparison signal;
   a comparator having a comparison signal input terminal supplied with said comparison signal and reference signal input terminal coupled to a reference voltage point for comparing the voltages of said comparison signal and said reference voltage point; and
   a positive feedback means including a resistor and coupled between the output of said comparator and said comparison signal input terminal, for compensating the output d.c. variation of said high pass filter during any period when said input data signal is continuously high or low, whereby the output of said comparator will have a level corresponding to the level ofj said input data signal even when said input data signal remains continuously at one of said high and low levels to thereby reproduce a data signal having variations of duration faithfully corresponding to the durations of said a.c. component variations.

2. A waveform converting circuit for receiving an input data signal having an A.C. component varying between high and low levels and providing an output corresponding to said A.C. component said circuit comprising:
   a comparator having a first input terminal and a second input terminal for comparing the voltages of said input data signal and a reference signal supplied to said first and second input terminals and providing said converting circuit output;
   a signal input terminal receiving said input data signal and connected to said first input terminal;
   an input low pass filter coupled between said signal input terminal and said second input terminal for filtering said input data signal and providing said reference signal; and
   positive non-d.c.-isolating feedback means, including a resistor, for feeding back the output of said comparator to said second input terminal in order to compensate the D.C. variation in said reference signal during any period when the A.C. component of said input data signal is continuously at a high or low level, whereby the output of said comparator will have a level corresponding to the level of said input data signal even when said input data signal remains continuously at one of said high and low levels, thereby reproducing a data signal having variations of duration faithfully corresponding to the durations of said A.C. component variations.

3. A waveform converting circuit comprising:
   a comparator having a first input terminal and a second input terminal for comparing the voltages of an input data signal and a reference signal respectfully fed to said first and second input terminals;

a signal input terminal connected to said first input terminal;

an input low pass filter coupled to said signal input terminal and said second input terminal for filtering said input data signal to provide said reference signal; and positive feedback means, including a feedback low pass filter, for feeding back the output of said comparator to said second input terminal in order to compensate the D.C. variation in said reference signal during any period when said input data signal is continuously at a high or low level, thereby reproducing a data signal having a duration faithfully dependent on the duration of said input data signal.

4. A waveform converting circuit, as in claim 2 or 3, said input low pass filter comprises a capacitor, a resistor and a pair of diodes connected in parallel to said resistor and in multually inverse polarities.

5. A waveform converting circuit comprising:

a high pass filter for receiving an input data signal;

a comparator having a first input terminal coupled to the output of said high pass filter and a second input terminal for comparing the voltages of said input signals fed to said first and second input terminals;

a limiter coupled to the output of said high pass filter; and positive feedback means, including a low pass filter, for feeding back from the output of said comparator to said second input terminal a voltage corresponding to the D.C. variation at the output of said high pass filter.

6. A waveform converting circuit, as in claim 5, said limiter comprises a pair of diodes connected in mutually inverse polarities and in parallel.

* * * * *

UNITED STATES PATENT AND TRADEMARK OFFICE
CERTIFICATE OF CORRECTION

PATENT NO. : 4,339,727
DATED : July 13, 1982
INVENTOR(S) : Kouzou Kage et al

It is certified that error appears in the above—identified patent and that said Letters Patent is hereby corrected as shown below:

Column 4, line 4 - change "$(C_3R_3R_4/(R_3+R_4)\simeq C_3R_3.$" to $$--C_3R_3R_4/(R_3+R_4)\simeq C_3R_3.--$$

Column 6, line 11 - change "a.c." to --A.C.--;

line 13 - change "a.c." to --A.C.--;

line 26 - change "d.c." to --D.C.--;

line 31 - change "ofj" to --of--;

line 34 - change "a.c." to --A.C.--;

line 53 - change "non-d.c." to --non-D.C.--

Signed and Sealed this

Twenty-first Day of September 1982

[SEAL]

Attest:

GERALD J. MOSSINGHOFF

Attesting Officer    Commissioner of Patents and Trademarks